(12) United States Patent
Martin et al.

(10) Patent No.: US 7,834,634 B2
(45) Date of Patent: Nov. 16, 2010

(54) LOW-POWER SWITCH STATE DETECTION CIRCUIT AND METHOD AND MOBILE TELEPHONE INCORPORATING THE SAME

(75) Inventors: David G. Martin, Bethlehem, PA (US); Richard Verney, Woking (GB); Robert W. Walden, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 54 days.

(21) Appl. No.: 11/123,569

(22) Filed: May 6, 2005

(65) Prior Publication Data

US 2006/0255812 A1 Nov. 16, 2006

(51) Int. Cl.
G01R 31/02 (2006.01)
G01R 31/327 (2006.01)
H01H 31/10 (2006.01)
(52) U.S. Cl. .................. 324/418; 324/424; 307/115
(58) Field of Classification Search .............. 324/415, 324/418, 424; 307/115
See application file for complete search history.

(56) References Cited

U.S. PATENT DOCUMENTS

| | | | | |
|---|---|---|---|---|
| 4,498,089 A | * | 2/1985 | Scardovi | 347/10 |
| 5,629,921 A | * | 5/1997 | Eastman et al. | 369/124.15 |
| 6,374,126 B1 | * | 4/2002 | MacDonald et al. | 455/569.1 |
| 6,466,036 B1 | * | 10/2002 | Philipp | 324/678 |
| 6,700,382 B2 | * | 3/2004 | Grassmann | 324/415 |
| 6,969,978 B2 | * | 11/2005 | Dening | 323/282 |
| 2004/0066208 A1 | * | 4/2004 | Liu et al. | 324/763 |
| 2004/0189330 A1 | * | 9/2004 | Herb et al. | 324/691 |
| 2005/0249354 A1 | * | 11/2005 | Patino et al. | 381/59 |
| 2006/0103435 A1 | * | 5/2006 | Chen et al. | 327/108 |

* cited by examiner

*Primary Examiner*—Jeff Natalini

(57) ABSTRACT

A circuit for, and method of, detecting a signal level on a node and a mobile telephone device incorporating the circuit or the method. In one embodiment, the circuit includes: (1) a switch coupled between a voltage source and the node, (2) a pulse generator coupled to the switch and configured to generate a pulse to control the switch and (3) a detection circuit coupled to the node and configured to detect a signal level at the node on closure of the switch.

24 Claims, 3 Drawing Sheets

LOW-POWER SWITCH STATE DETECTION CIRCUIT AND METHOD AND MOBILE TELEPHONE INCORPORATING THE SAME

TECHNICAL FIELD OF THE INVENTION

The present invention relates to a detection circuit, and particularly but not exclusively to a detection circuit for detecting depression of a push-button switch on electronic equipment.

BACKGROUND OF THE INVENTION

Portable devices, such as mobile or cellular telephones, are often equipped with a headset. The headset includes a microphone and one or two speakers. The headset further includes a push-button switch electrically connected across the microphone, and which may be used, for example, to "wake-up" the phone. A detection circuit is needed to reliably detect closure of the push-button switch, which detection circuit must not interfere with the normal operation of the microphone 112 other than when the button is depressed.

It is also advantageous to provide such a detection circuit which does not unnecessarily consume power. Preferably the detection circuit should be able to remain active for long periods of time with very low power consumption.

Accordingly, what is needed in the art is a better way to detect the state of a switch. More specifically, what is needed in the art is a less power consumptive way to detect whether or not a push-button is depressed.

SUMMARY OF THE INVENTION

To address the above-discussed deficiencies of the prior art, the present invention provides a circuit for detecting a signal level on a node. In one embodiment, the circuit includes: (1) a switch coupled between a voltage source and the node, (2) a pulse generator coupled to the switch and configured to generate a pulse to control the switch and (3) a detection circuit coupled to the node and configured to detect a signal level at the node on closure of the switch.

In another aspect, the present invention provides a method of detecting a signal transition. In one aspect, the method includes: (1) periodically switching a bias voltage to a node, (2) monitoring the node and (3) detecting a change in the state of the node on switching of the bias voltage.

In yet other aspects, the present invention provides a mobile telephone device incorporating the circuit or the method. The mobile telephone device otherwise may be of any conventional or later-developed kind or origin.

The foregoing has outlined preferred and alternative features of the present invention so that those skilled in the art may better understand the detailed description of the present invention that follows. Additional features of the present invention will be described hereinafter that form the subject of the claims of the present invention. Those skilled in the art should appreciate that they can readily use the disclosed concept and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
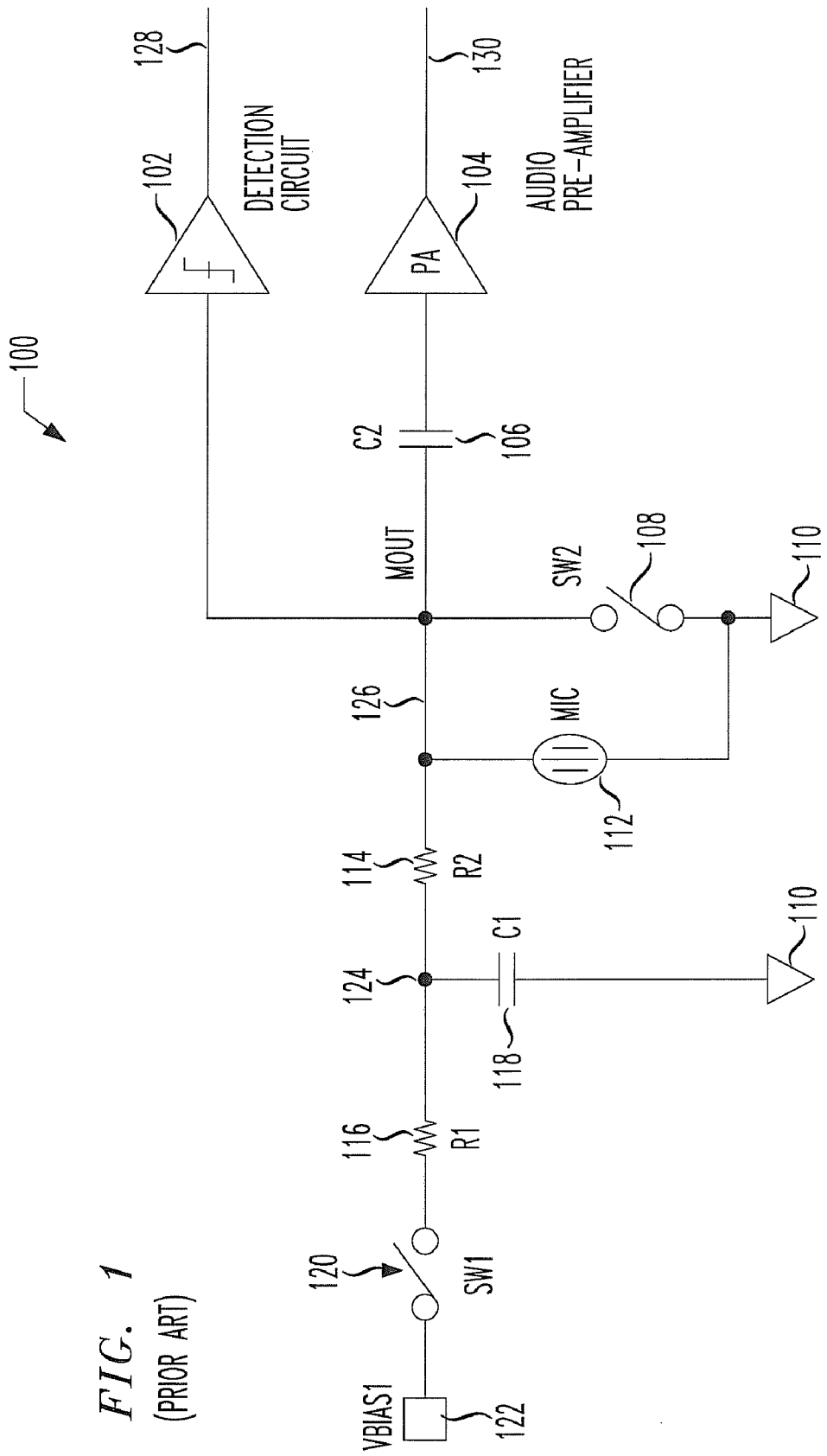
FIG. 1 illustrates a schematic diagram of a prior art technique for detecting the state of a switch.

Before describing the FIGUREs, some aspects and alternative embodiments for the detection circuit of the present invention will be discussed. In general, the present invention provides a circuit for detecting a signal transition. The circuit includes: a switch connected between a bias voltage and a node, a pulse generator for generating a pulse to control the switch, and a detection circuit having a connection to the node, wherein the detection circuit is adapted to detect a signal level at the node on closure of the switch. The signal level may be a voltage level, a current level or a resistance level. The detection circuit may be one or more of a voltage detection circuit, a current detection circuit and a resistance detection circuit. For detecting a voltage level, the detection circuit has an input connected to the node. For detecting a current level, a sensor configured to sense the current flowing into or out of the node is provided.

The circuit may further comprise a further switch connected between the node and a ground potential. In such case, the detection circuit is adapted to detect a level at the node determined by the state of the further switch.

The pulse generator may further control the detection circuit. The pulse generator may open and close the switch. In such case, the detection circuit is enabled when the switch is closed.

The detection circuit may be adapted to detect a signal at the node responsive to a stable signal at the node on a series of successive switch closures. The detection circuit may be adapted to compare a current signal level at the node to a previous signal level to detect a transition at the node. The transition may be responsive to closure of a further switch connected between the node and a ground potential.

A further switch may be connected between a further bias voltage and the node. The further switch may be a control switch for the device. The control switch may be an on-off switch for the device. The switch and the further switch may be controlled such that when one is closed the other is open. When the further switch is closed the switch may be disabled, and when the further switch is open the switch is enabled.

The circuit may further comprise a still further switch connected between the node and the ground potential. In such case, the detection circuit is adapted to detect a signal level at the node determined by the state of the still further switch. The further switch may be a control switch of the device, and the detection circuit is adapted to detect the state of the still further switch, the further switch being closed to provide a bias voltage to the detection circuit when the control switch is open.

The device may be a headset, and the further switch may be a push-button of said headset. A mobile telephone device may incorporate a detection circuit as defined. A headset of an electronic device may incorporate a detection circuit as defined.

In another aspect, the present invention provides a method of detecting a signal transition. The method may include: periodically switching a bias voltage to a node, monitoring the node and detecting a change in the state of the node on switching of the bias voltage.

The method may further comprise selectively connecting the node to a ground potential, in which case, the detecting involves detecting a signal level at the node determined by the state of selective connection.

The detection circuit may detect a signal at the node responsive to a stable signal at the node on a series of successive switch closures.

The method may include comparing a current signal level at the node to a previous signal level to detect a transition at the node. The transition may be detected responsive to closure of a further switch connected between the node and a ground potential. The further switch may be closed disabling the switch, or the further switch may be opened enabling the switch.

The method may further include connecting a still further switch between the node and the ground potential, the detecting a signal level at the node being determined by the state of the still further switch. The method may further include detecting the state of the still further switch, the further switch being closed to provide a bias voltage to the detection circuit when the control switch is open.

In one embodiment, the present invention provides a circuit for detecting a signal transition. The circuit may include: a switch connected between a first bias voltage and an output node, a switch connected between the output node and ground, a third switch connected between a second bias voltage and the output node, a detection circuit connected to the output node for detecting a state thereof determined by the state of the switch and a pulse generator for generating a pulse to control the third switch. The third switch is periodically closed to allow detection by the detection circuit of the state of the node. The control of the third switch is advantageously enabled when the switch is open. The switch being open represents that a device to which the detection circuit is connected is switched off. The detection circuit is advantageously switched on and off in synchronization with the third switch. The switch may be connected across a microphone. The switch may be connected to the output node via an R-C circuit. The switch may be of the normally-open, push-button type.

In an alternate embodiment, the present invention provides a circuit for detecting a signal transition including a control switch for connecting a first bias voltage to an output node and a detection switch for connecting a second bias voltage to the node. The detection switch enables detecting of the state of a further switch connected between the node and a ground potential.

The present invention is described herein by way of reference to particular examples, and particularly by way of reference to the use of a detection circuit in a headset which may be used in conjunction with a mobile telephone. It will be understood, however, that the present invention is not limited to such specific applications, and the detection circuit of the present invention, and embodiments thereof, may have wider applicability.

Having described various embodiments of the present invention in general, reference will now be made to the FIGURES. Accordingly, referring initially to FIG. 1, illustrated is a schematic diagram of a prior art technique for detecting the state of a switch. FIG. 1 shows a microphone circuit includes a microphone on-off switch SW1 120 having one terminal connected to the bias supply voltage VBIAS1 122. The other terminal of the microphone on-off switch SW1 120 is connected to one terminal of a resistor R1 116. A capacitor C1 118 and a further resistor R2 114 have terminals thereof connected commonly with the other terminal of the resistor R1 116 at a common node 124. The other terminal of the capacitor C1 118 is connected to a ground 110, and the other terminal of the resistor R2 114 is connected to a line or node 126.

A microphone 112 is connected between the line 126 and the ground connection 110. A switch SW2 108 is connected between the line 126 and the ground connection 110. The line 126 is connected to a first terminal of a capacitor C2 106, which has a second terminal connected to the input of an audio preamplifier 104 that generates an output signal on a line 130. The line 126 additionally forms an input to a detection circuit 102 which produces an output on a line 128.

The illustrated embodiment of the microphone on-off switch SW1 120 serves as a push-button on-off switch for the microphone 112. The control of the microphone on-off switch SW1 120 is outside the scope of the present invention, but one skilled in the art will appreciate that the control of the microphone on-off switch SW1 120 may be via, for example, a digital signal processor (DSP). In normal operation, the microphone on-off switch SW1 120 is closed and the microphone 112 is on. The bias supply voltage VBIAS1 122 typically provides a current of 0.5 mA or more, such that the line 126, which may be considered an output node of the circuit of FIG. 1 and is further labeled MOUT in FIG. 1, has a DC level midway between the bias supply voltage VBIAS1 122 and the ground 110.

When the switch SW2 108 (which, in the illustrated embodiment, is of the normally-open push-button type) is depressed, the node MOUT is connected to the ground 110 by a low resistance path, and the DC voltage at the node MOUT drops to close to the potential of the ground 110.

With the microphone on-off switch SW1 120 closed, a simple comparator may be used to detect the closure of the switch SW2 108 connected across the microphone 112. The detection circuit 102 may thus simply be implemented as a comparator, to detect closure of the switch SW2 108.

The output of the detection circuit 102 on the line 128 generates a signal which may switch a device to which the headset is connected on or off in dependence on its initial state prior to depression of the switch SW2 108. The device to which the headset is connected may be a mobile telephone.

The audio preamplifier 104 is an amplifier for signals detected by the microphone 112. The output of the audio preamplifier 104 on the output line 130 is thus connected to, for example, a transmit channel of a mobile telephone, or a recording channel of an audio recorder. The circuitry to which the output line 130 of the audio preamplifier 104 is connected is not necessarily provided in the headset itself, but may be provided in a device to which the headset is connected, either wirelessly or wired. Indeed the preamplifier 104 itself may not be provided in the headset.

In general the depression of a button to close the switch SW2 is detected to generate a signal on a line 128, which signal is processed in accordance with a given implementation.

The specific use of the detecting the closure of the switch SW2 108 is application specific. When the switch SW2 108 is open, the node MOUT is at a mid-level, as discussed hereinabove, and the microphone circuitry is used in normal operation. The closure of the switch SW2 108 causes the node MOUT to go to a ground level, and this may be used as a control signal to initiate some action.

It will be understood from reference to FIG. 1 that the closure of the switch SW2 108 can only be detected when the switch SW1 120 is closed. When the microphone circuit is in active operation, and being used, the technique for detecting closure of the switch SW2 108 works well, as it is necessary for the switch SW1 120 to be closed during active operation to operate the microphone circuit. Thus in active operation of the microphone circuit, the arrangement of FIG. 1 for detecting closure of the switch SW2 108 works well enough. However in "standby" operation, where the microphone 112 is not active, the arrangement of FIG. 1 is far from acceptable. Requiring the microphone on-off switch SW1 120 to remain closed solely to be able to detect closure of the switch SW2 108 results in a significant power consumption and wastage. It would be advantageous for the button detection circuit, or switch state detection circuit, to be able to operate at a much lower power level for long periods of time. A first problem associated with the arrangement of FIG. 1 is thus a power problem.

A second problem associated with the microphone 112 of FIG. 1 is a high intensity sound problem. Loud noises into the microphone 112 can cause large variations of the voltage at the node MOUT. These large variations may cause the detection circuit 102 to misinterpret the variation as closure of the switch SW2 108. It would be advantageous to avoid such erroneous detections.

To provide a solution to the power problem, it would be possible to cycle the bias supply voltage VBIAS1 122 and the detection circuit 102 on and off on a sporadic basis, so as to sporadically (and perhaps periodically) check whether the switch SW2 108 is depressed. However, because the time constant T1 of the R—C filter formed by the resistor R1 116 and capacitor C1 118 is advantageously comparable to the preferred sampling interval, not much power can be saved by cycling the bias supply voltage VBIAS1 122 in this way.

Figure 2:
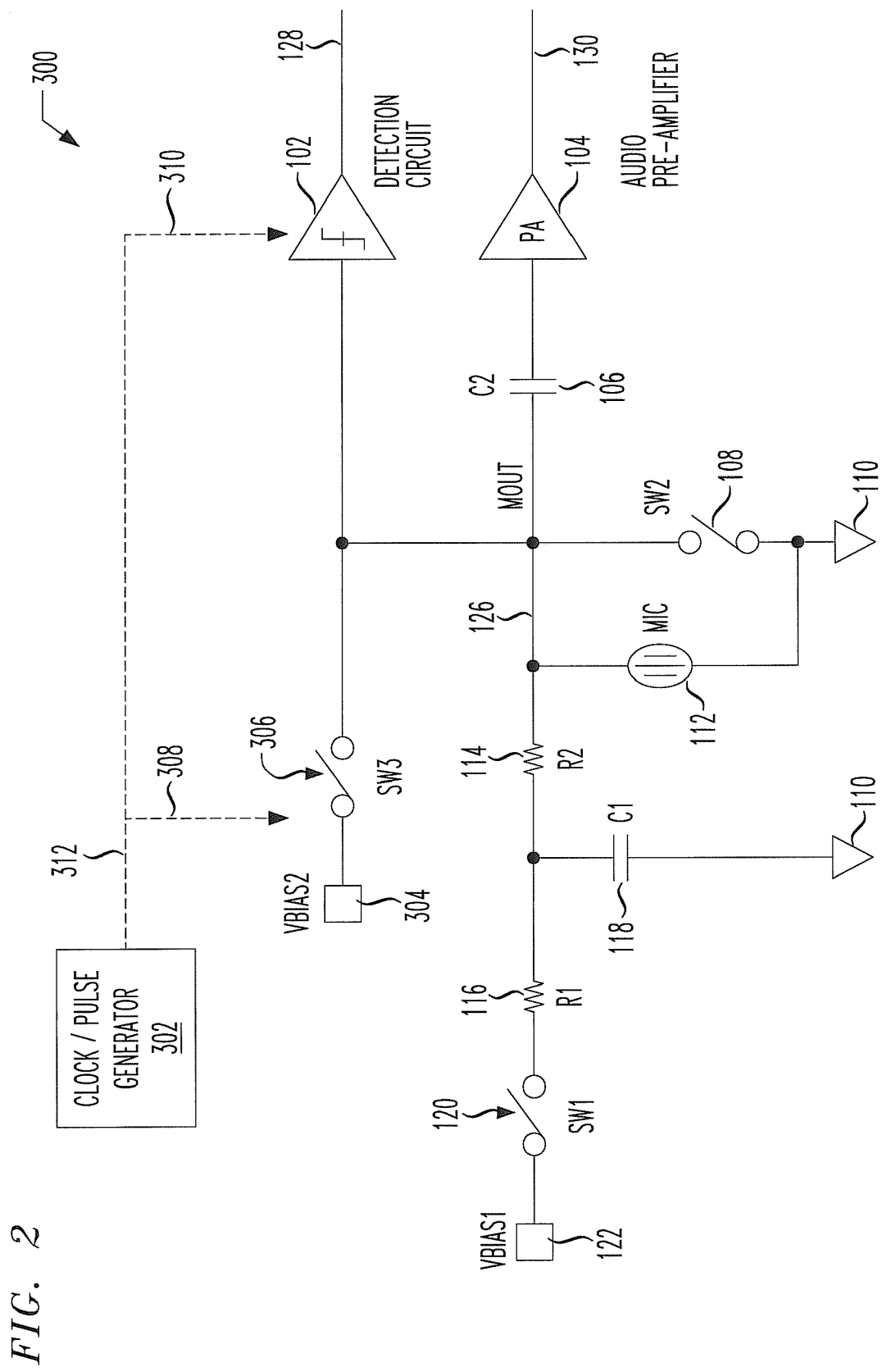
FIG. 2 illustrates a schematic diagram of one embodiment of a detection circuit constructed according to the principles of the present invention.

FIG. 2 illustrates a schematic diagram of one embodiment of a detection circuit constructed according to the principles of the present invention. With reference to FIG. 2, an improved detection circuit in accordance with the present invention is applied to the microphone circuit arrangement of FIG. 1 which overcomes at least one of the prior art disadvantages. In FIG. 2, like reference numerals are used to denote elements corresponding to elements shown in FIG. 1.

The circuit of FIG. 2 is modified to include a switch SW3 306, having one terminal connected to a second bias voltage VBIAS2 304 and another terminal connected to the node MOUT. A clock/pulse generator 302 is further provided, generating a control signal on line 312 which provides a control to the switch SW3 306 on a line 308 and a control to the detection circuit 102 on a line 310.

By the provision of the switch SW3 306, the detection circuit can operate independently of the switch SW1. Thus when the microphone 112 is inactive, the microphone on-off switch SW1 120 may be left open, thus achieving a power saving. The switch SW3 306 is closed to provide the necessary bias voltage for detecting closure of the switch SW2 108. The second bias voltage VBIAS2 304 should be provided with some form of internal resistance. Simply by providing the switch SW3 306 on its own, some power saving is achieved, but a significant power saving over the arrangement of FIG. 1 with the microphone on-off switch SW1 120 closed is not achieved.

Thus, for a significant power-saving, the clock/pulse generator 302 is preferably provided to pulse the switch SW3 306 on and off, such that the second bias voltage VBIAS2 304 is only intermittently applied.

It should be noted that the advantages obtained by providing the switch SW3 306 and pulsing the switch SW3 306 would not be achieved by simply pulsing the microphone on-off switch SW1 120. A significant amount of power is required to charge the capacitor C1 118, and thus although pulsing the microphone on-off switch SW1 120 would provide some power saving over having the microphone on-off switch SW1 120 permanently closed, a significant power saving is not achieved. Nevertheless, simply modifying the arrangement of FIG. 1 to pulse the microphone on-off switch SW1 120 may offer some advantage which may be useful in some applications.

Although the presence of C1 118 limits the effective advantage of pulsing SW1, it should be noted that the R1-C1 arrangement is necessary to filter any noise which may be present on the bias supply voltage VBIAS1 122 and therefore removing or changing the value of C1 118 is not an option. The second bias voltage VBIAS2 304 does not have to be filtered for noise, since it simply provides a bias voltage for the detection circuit, and therefore does not suffer this drawback.

Thus in operation, the clock/pulse generator 302 operates to periodically close the switch SW3 306 and switch on the detection circuit 102, to detect whether the switch SW2 108 is closed.

Preferably a DSP (not shown), which may control the clock/pulse generator 302, ensures that the microphone on-off switch SW1 120 and the switch SW3 306 are not closed simultaneously. When the microphone 112 is in an active mode of operation, the microphone on-off switch SW1 120 is closed, and the switch SW3 306 is not needed to detect closure of the switch SW2 108 and is preferably disabled. When the microphone 112 is in inactive or standby mode, the microphone on-off switch SW1 120 is opened and the switch SW3 306 is periodically switched, to provide a low-power technique for detecting closure of the switch SW2 108.

Thus the technique according to the present invention uses an electronically switched bias supply and detection circuit, both connected to a node MOUT which transitions to indicate closure of a switch or change of a bias potential. The bias supply and detection circuit may be switched on for as little as a few microseconds every several milliseconds, and still be able to reliably detect the state of the button switch. Although the power consumed when the detection circuit is enabled is similar to the power consumed when the microphone 112 is in use, the average power consumption is much smaller because of the short duty cycle.

The exemplary operation advantageously employs a slow clock, typically in the range of 10-100 Hz, which determines how often the detection circuit is powered-up, and a delay cell or higher-frequency clock which determines the duration of each sample period.

The detection circuit arrangement of FIG. 2 may be further enhanced. As discussed hereinabove, a second problem associated with the detection circuit of FIG. 1 is that the detection circuit may erroneously detect depression of the push-button, due to variations at the node MOUT. In accordance with a further enhancement to the detection circuit arrangement of FIG. 2, logic may be provided to offer a higher immunity to noise and switch bounce. Such an arrangement may require that several consecutive samples of the state of the switch SW2 108 must be consistent before a change in the state of the switch is propagated to the detection circuit output on the line 128.

Thus, this enhancement ensures that the state of the node MOUT indicates a switch depression for a particular period of time before the detection circuit confirms such as a switch depression. It should be noted that this further enhancement may be implemented in the arrangement of FIG. 1, and is not limited to being implemented in conjunction with the specific detection circuit, using the switch SW3 306, of FIG. 2. For example in an arrangement where it was found to be advantageous simply to pulse the switch SW3 306 of FIG. 1, then the use of logic to ensure a consistent result over a number of pulses may be used. Even without pulsing, it may be determined whether the state of a node remains constant over a period from a start time to a stop time.

A further enhancement of the arrangement of FIG. 2 is to provide logic which generates an input to a microcontroller or a DSP to initiate an action in response to the change of state of the button switch.

The same detection circuit, as shown in FIG. 2, can be used in either of two operating modes. In a high-power operating mode, the microphone 112 bias supply is switched on, i.e., the microphone on-off switch SW1 120 is closed. This mode is most appropriate when the microphone 112 is in an active operation, so that the bias supply must be active. In this high-power mode of operation, the detection circuit using the switch SW2 108 and detection circuit 102 is operable to detect closure of the switch SW2 108.

In a low-power mode of operation, the microphone 112 bias supply is switched off, i.e., the microphone on-off switch SW1 120 is open. However in such mode of operation the detector logic provided by the switch SW3 306 is enabled, and switched on and off to sample the state of the detection button. Thus the switch SW2 108 and the detection circuit 102 are operable to detect closure of the detection button.

Thus the same detection circuitry (the switch SW2 108 and the detection circuit 102) is used regardless of the mode of operation of the microphone circuit. When the microphone circuit is active the detection circuit operates in a similar manner to that shown in FIG. 1. When the microphone circuit is inactive, or in standby mode, the bias supply voltage VBIAS1 122 need not be provided, and thus the additional circuitry illustrated in FIG. 2 is used.

For completeness, it is pointed out that all components other than the microphone 112, the switch SW2 108, and possibly the resistor R2 114 would preferably be mounted on the circuit board of a telephone or other device. This may include discrete components, one or more integrated circuit chips or a combination of both.

Figure 3:
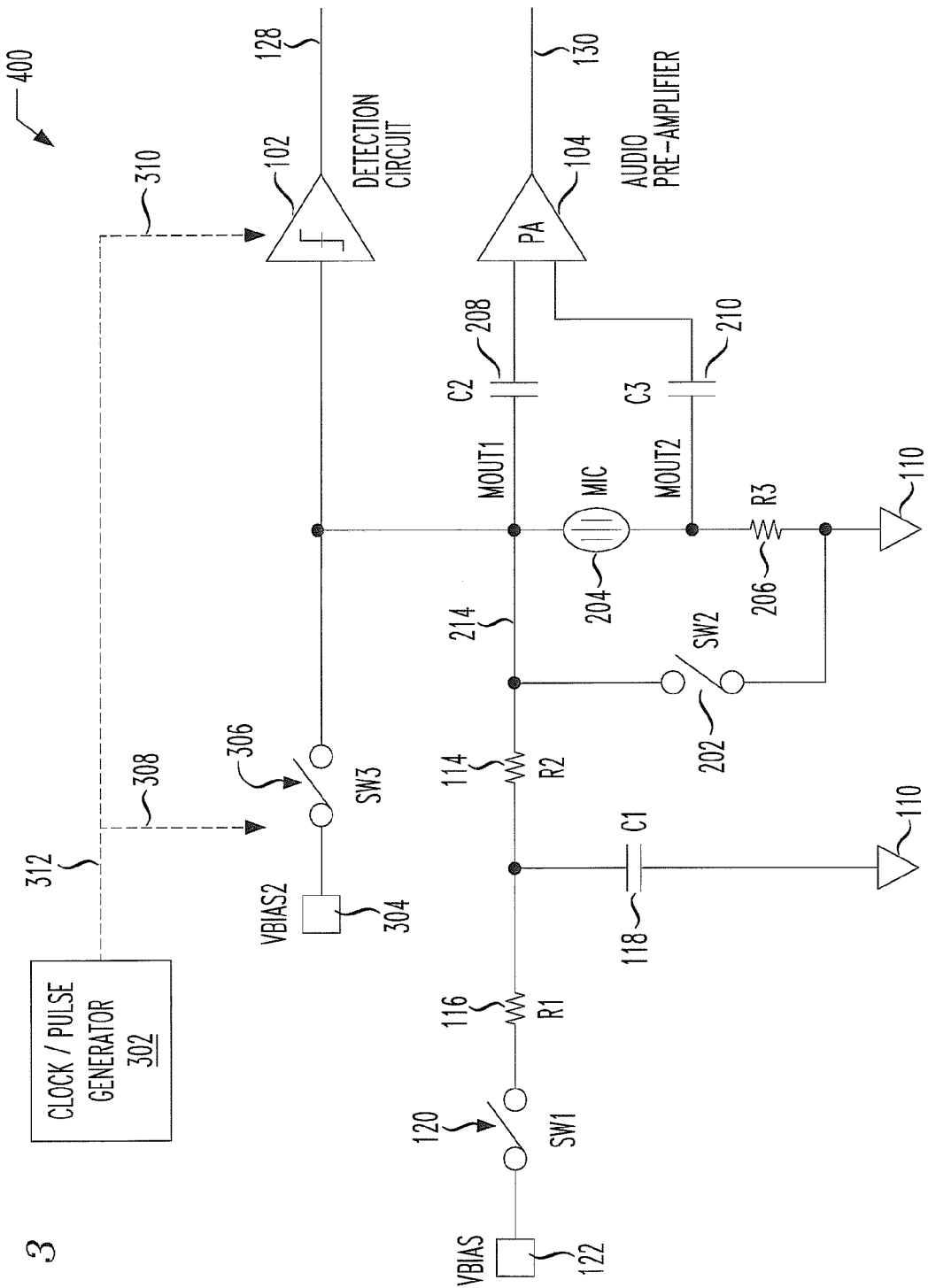
FIG. 3 illustrates a schematic diagram of another embodiment of a detection circuit constructed according to the principles of the present invention.

Turning now to FIG. 3, illustrated is a schematic diagram of another embodiment of a detection circuit constructed according to the principles of the present invention. FIG. 3 shows a microphone circuit which is implemented as a differential amplifier, as opposed to the single input amplifier of FIG. 2. Like reference numerals are used in FIG. 3 to denote elements which are the same as those shown in either of FIG. 1 or 2.

It can be seen that the audio preamplifier 104 is provided with a differential input pair, each input being provided through a respective capacitor C2 208 and C3 210. First terminals of each capacitor C2 208 and C3 210 are thus connected to respective input of the amplifier 104. The other terminals of the capacitors C2 and C3 are connected to opposite terminals of the microphone 112 204. The connection point of the microphone 112 with the capacitor C2 defines a first output node MOUT1, and the connection point of the microphone 112 with the capacitor C3 defines a second output node MOUT2. A resistor R3 206 is connected between the second output node MOUT2 and ground. In practice the resistor R3 206 may be mounted with the microphone 112. The switch SW2 202 being the push-button switch is connected in parallel across the microphone 112 204 and the resistor R3 206, having a first terminal connected to the first output node MOUT1 and a second terminal connected to ground. The switch SW3 306 has its first terminal connected to the bias voltage VBIAS2 304 as in FIG. 2, and its second terminal connected to the first output node MOUT1. The first output node MOUT1 is further connected to the input of the detection circuit 102. Thus the first output node MOUT1 effectively corresponds to the output node MOUT of FIG. 2.

The operation of a differential microphone 112 as shown in FIG. 3, as opposed to the single input microphone 112 of FIG. 2, will be understood by one skilled in the art, and is not described in detail herein. FIG. 3 serves to illustrate that the principles of the present invention may be used in more than one microphone 112 arrangement.

The detection circuit may be implemented as a voltage comparator for detecting a voltage change, but other implementations are possible. In an alternative, for example, the detection circuit may be implemented as a current or resistance comparator. This would require an arrangement where the current could be sensed through the switch SW3 306 (and/or the microphone on-off switch SW1 120). A modification to the described embodiments to allow for a current sensing arrangement will be within the scope of one skilled in the art. In general, the detection circuit is provided to detect a level or state, and preferably to thereby identify a change therein.

Furthermore the principles of the detection circuit as described herein are not limited in their use to microphone circuits. The principles may be employed in any arrangement where it is necessary to detect a signal transition.

A further advantage of the detection circuit as described herein is that it may be used to distinguish one type of headset from another, when any of two or more types of headsets which have the same type of plug connector may be connected. For example, the detection circuit can distinguish a headset with a microphone and a monaural speaker from a headset with stereo speakers, because a speaker in a stereo headset generally provides a much lower resistance path to ground than does the microphone.

Thus, in alternative embodiments, the present invention provides an advantageous and efficient method for detecting a headset button-press. The detection circuit is compatible with normal operation of a microphone, but also provides for low-power operation when the microphone is not in use or is in a standby mode of operation. The detection circuit may therefore be used, for example, to switch from inactive mode to active mode responsive to detecting the button-press depression. The same detection circuit may also be advantageously used to distinguish among different types of headsets that may be plugged into a headset connector.

The present invention has been described herein by way of example embodiments relating to implementation in a headset for use with a mobile telephone device. The present invention is not limited, however, in its applicability to mobile telephone devices or to headsets. The present invention, and embodiments thereof, may be used in any suitable device where it is advantageous to detect transition of a signal.

Although the present invention has been described in detail, those skilled in the art should understand that they can make various changes, substitutions and alterations herein without departing from the spirit and scope of the present invention in its broadest form.

What is claimed is:

1. A circuit for detecting a signal level on a node, comprising:
    a switch coupled between a voltage source and said node;
    a detection circuit coupled to said node and configured to detect a signal level at said node only on closure of said switch; and
    a pulse generator coupled to said switch and said detection circuit and configured to generate a single pulse in a cycle that controls both the detection circuit and the switch such that the single pulse closes said switch and enables said detection circuit at the same time, wherein said switch is open and said detection circuit is disabled when said single pulse is not generated.

2. The circuit as recited in claim 1 further comprising a further switch connected between said node and a ground potential, said detection circuit being configured to detect a level at said node determined by said state of said further switch.

3. The circuit as recited in claim 1 wherein said detection circuit is configured to detect a signal at said node responsive to a stable signal at said node on a series of successive switch closures.

4. The circuit as recited in claim 1 wherein said detection circuit is configured to compare a current signal level at said node to a previous signal level to detect a transition at said node.

5. The circuit as recited in claim 4 wherein said transition is responsive to closure of a further switch connected between said node and a ground potential.

6. The circuit as recited in claim 1 further comprising a further switch connected between a further bias voltage and said node.

7. The circuit as recited in claim 6 wherein said further switch is a control switch for said device.

8. The circuit as recited in claim 6 wherein said switch and said further switch are controlled such that when one is closed said other is open.

9. The circuit as recited in claim 6 wherein said switch is disabled when said further switch is closed, and said switch is enabled when said further switch is open.

10. The circuit as recited in claim 6 further comprising a still further switch connected between said node and said ground potential, said detection circuit being configured to detect a signal level at said node determined by said state of said still further switch.

11. The circuit as recited in claim 10 wherein said further switch is a control switch of said device, and said detection circuit is configured to detect said state of said still further switch, said further switch being closed to provide a bias voltage to said detection circuit when said control switch is open.

12. The circuit as recited in claim 11 wherein said device is a headset and said further switch is a push-button of said headset.

13. The circuit as recited in claim 1 wherein said circuit is contained within a mobile telephone device.

14. The circuit as recited in claim 1 wherein said circuit is contained within a headset of an electronic device.

15. A method of detecting a signal transition at a node, comprising:
    generating a single pulse in a cycle with a pulse generator, said single pulse:
    closing a switch, said switch periodically switching a bias voltage to said node, and;
    enabling a detector, said detector detecting a change in said state of said node only on closure of said switch, wherein said switch is open and said detector is disabled when said single pulse is not generated.

16. The method as recited in claim 15 further comprising selectively connecting said node to a ground potential, said detecting comprising detecting a signal level at said node determined by said state of selective connection.

17. The method as recited in claim 15 wherein said detecting comprises detecting a signal at said node responsive to a stable signal at said node on a series of successive switch closures.

18. The method as recited in claim 15 further comprising comparing a current signal level at said node to a previous signal level to detect a transition at said node.

19. The method as recited in claim 18 wherein said transition is detected responsive to closure of a further switch connected between said node and a ground potential.

20. The method as recited in claim 15 further comprising providing a further switch between a further bias voltage and said node.

21. The method as recited in claim 20 further comprising controlling said switch and said further switch such that when one is closed said other is open.

22. The method as recited in claim 20 further comprising:
    disabling said switch when said further switch is closed; and
    enabling said switch when said further switch is open.

23. The method as recited in claim 20 further comprising connecting a still further switch between said node and said ground potential, said detecting a signal level at said node being determined by said state of said still further switch.

24. The method as recited in claim 23 further comprising detecting said state of said still further switch, said further switch being closed to provide a bias voltage to said detection circuit when said control switch is open.

* * * * *